United States Patent
Aurongzeb et al.

(10) Patent No.: US 12,189,432 B2
(45) Date of Patent: Jan. 7, 2025

(54) HYBRID ASSEMBLY OF AN ULTRA THIN INFORMATION HANDLING SYSTEM HOUSING

(71) Applicant: Dell Products L.P., Round Rock, TX (US)

(72) Inventors: Deeder M. Aurongzeb, Austin, TX (US); Brandon J. Brocklesby, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 431 days.

(21) Appl. No.: 17/546,839

(22) Filed: Dec. 9, 2021

(65) Prior Publication Data

US 2022/0100237 A1    Mar. 31, 2022

Related U.S. Application Data

(62) Division of application No. 16/898,759, filed on Jun. 11, 2020, now Pat. No. 11,262,804.

(51) Int. Cl.
    *G06F 1/16*    (2006.01)
    *H05K 13/00*   (2006.01)

(52) U.S. Cl.
    CPC .......... *G06F 1/1656* (2013.01); *G06F 1/1635* (2013.01); *G06F 1/1637* (2013.01); *G06F 1/1662* (2013.01); *H05K 13/00* (2013.01); Y10T 29/49002 (2015.01)

(58) Field of Classification Search
    CPC .... G06F 1/1616; G06F 1/1635; G06F 1/1637; G06F 1/1656; G06F 1/1662
    See application file for complete search history.

(56) References Cited

U.S. PATENT DOCUMENTS

| | | | |
|---|---|---|---|
| 8,897,001 B2 | 11/2014 | Knopf et al. | |
| 9,107,299 B2 | 8/2015 | Rayner | |
| 10,369,742 B2 | 8/2019 | Scribner et al. | |
| 11,262,804 B2* | 3/2022 | Aurongzeb | ........... G06F 1/1635 |
| 11,513,564 B2* | 11/2022 | Chang | ................... G06F 1/1656 |
| 2021/0389806 A1* | 12/2021 | Aurongzeb | ............ H05K 13/00 |
| 2022/0100237 A1* | 3/2022 | Aurongzeb | ............ H05K 13/00 |

FOREIGN PATENT DOCUMENTS

| | | | | |
|---|---|---|---|---|
| EP | 2047983 B1 | | 4/2009 | |
| EP | 2844343 B1 | * | 11/2018 | ........... A61B 17/225 |
| ES | 2641197 T3 | * | 11/2017 | ........... F01D 21/045 |
| WO | 2016024780 A1 | | 1/2016 | |
| WO | WO-2016118124 A1 | * | 7/2016 | ............ B22F 3/1055 |

* cited by examiner

*Primary Examiner* — Minh N Trinh
(74) *Attorney, Agent, or Firm* — Zagorin Cave LLP; Robert W. Holland (57) ABSTRACT

An information handling system housing is formed to provide a reduced overall material thickness by forming a planar housing piece of a first metal, such as aluminum, with an interior surface having channels of reduced thickness and laser sintering a pattern in the channel with a second material, such as a pattern of interconnected hexagons formed by lines of steel. Locally formed shapes of components disposed in the housing, such as battery shape, provide room for the components with improved stiffness of the housing to meet structural constraints.

8 Claims, 8 Drawing Sheets

HYBRID ASSEMBLY OF AN ULTRA THIN INFORMATION HANDLING SYSTEM HOUSING

CROSS REFERENCE TO RELATED APPLICATIONS

This application is a divisional of U.S. patent application Ser. No. 16/898,759, filed Jun. 11, 2020, entitled "Ultra Thin Information Handling System Housing with Hybrid Assembly," naming Deeder M. Aurongzeb and Brandon J. Brocklesby as inventors, which application is incorporated herein by reference in its entirety.

BACKGROUND OF THE INVENTION

Field of the Invention

The present invention relates in general to the field of portable information handling systems, and more particularly to an ultra thin information handling system housing with hybrid assembly.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In clamshell configurations, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility. More recently, convertible configurations integrate a touchscreen display over both housing portions in the place of the keyboard, such as by using the touchscreen to present a virtual keyboard that accepts touches at keys presented as visual images.

Generally, end users prefer portable information handling systems that have minimal thickness and weight for ease of mobile use and storage. Typically an end user selects an information handling system based upon the display size, which determines the system length and width, and then system capabilities are a trade off with system thickness. For example, systems that have more capable processing components tend to have greater power consumption and thermal management issues, which tend to resolve with greater housing thickness. For instance, increased space within a housing interior provides a greater amount of space for cooling airflow to reject excess thermal energy and for placement of mechanical thermal transfer devices, such as heat pipes. Generally, larger convertible systems also tend to have increased housing thickness and structure to ensure sufficient robustness to support coupling of hinges and torsional forces related to housing rotation between open and closed positions.

Various materials may be selected for manufacture of information handling system housings with a variety of different densities and tensile strengths, each resulting in housings having different characteristics. Based upon the characteristics of the material, the housings are constructed to withstand defined torsional and puncture parameters. One common housing material is aluminum, which tends to provide light weight but thicker housings with its low density. Another common housing material is stainless steel, which provides a heavier but thinner housing due to its higher density and strength. For example, a 0.75 mm thick aluminum housing has similar structural characteristics to a 0.2 mm thick stainless steel housing. Other materials include titanium, magnesium and carbon fiber. In addition to mechanical constraints, selection of a particular material may be based upon appearance and post-manufacture treatments, such as painting or other processes.

As manufacturers have moved towards information handling systems having reduced thickness, conventional housing materials have presented limitations for reduced material thickness that provides adequate strength to resist puncture and torsional forces. For instance, to manufacture a portable information handling system with less than 1 cm of thickness, the housing material itself should have less than 0.4 mm of thickness while maintaining structural and puncture constraints and minimizing weight. Aluminum at such minimal thickness is difficult to form and machine into desired housing shapes within defined constraints.

SUMMARY OF THE INVENTION

Therefore, a need has arisen for a system and method which provides an ultra thin housing for an information handling system.

In accordance with the present invention, a system and method are provided which substantially reduce the disadvantages and problems associated with previous methods and systems for manufacture of an information handling system housing. A housing plate of a first material has a recess of reduced thickness at an inner surface with a secondary material integrated with a pattern to reinforce the plate for enhanced stiffness with reduced thickness of the first material.

More specifically, an information handling system processes information with processing components disposed in a housing. The housing is formed from a planar plate of a first material, such as aluminum. The interior surface of the housing has one or more recesses formed that reduce the thickness of the planar plate, such as by having a thicker first material at all or a portion of the perimeter of the planar plate and a thinner first material in a central region. A secondary material, such as stainless steel or a ceramic, is integrated with the first material at the reduced thickness to enhance the stiffness of the planar plate. For instance, lines of stainless steel are laser sintered at the inner surface portions having reduced thickness to form a pattern that reinforces the planar plate. In one example embodiment, the secondary material forms interconnected hexagons with openings that aid in weight reduction. In another example, the combined thickness of the planar plate in the recessed area and the secondary material are approximately equal to the thickness of the planar plate in the thicker portions, such as at the perimeter. In another example, lines etched in the interior surface are filled with the secondary material and laser sintered to reinforce the planar plate. In some instances, recess areas are formed to coincide with component placement within the housing so that the components have additional room at assembly of the information handling system.

The present invention provides a number of important technical advantages. One example of an important technical advantage is that an ultra thin housing is provided for manufacture of an information handling system with a minimal Z-height. Thickness of a lighter, less dense and less stiff material is reduced while housing stiffness and puncture constraints are maintained. For example, an aluminum plate formed as a housing portion with a 0.75 mm thickness to meet housing structure constraints can be replaced by a 0.6 mm thick plate having a recessed area within a perimeter of reduced aluminum thickness of 0.4 mm that is reinforced by a stainless steel pattern of 0.2 mm thickness. The stainless steel pattern enhances housing stiffness to meet structure constraints of the thicker aluminum plate while reducing housing thickness and weight.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system housing provides a thin yet robust structure with a plate of a primary metal reinforced in an interior recess by a pattern of a secondary metal integrated with the primary metal in the recess. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
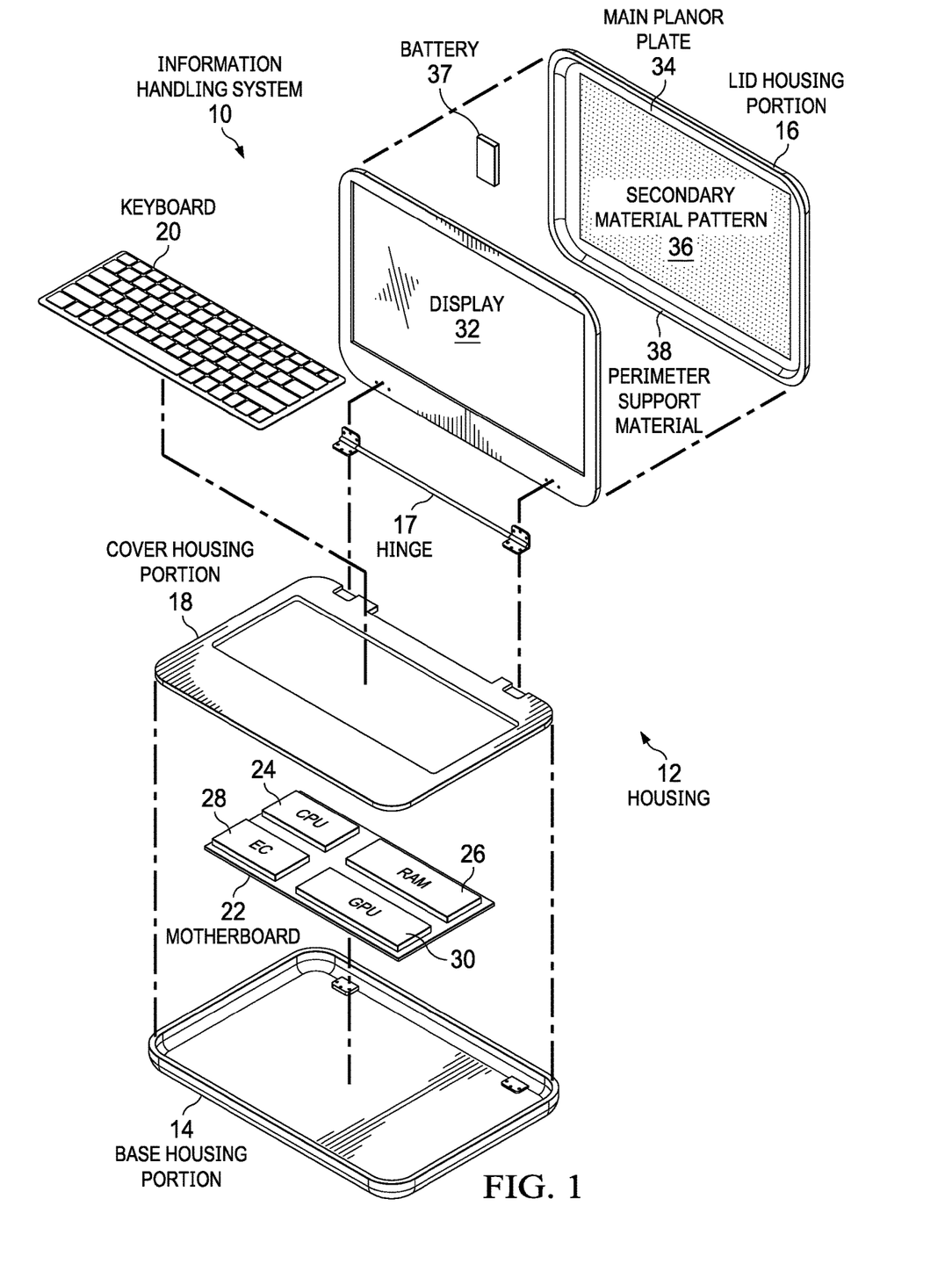
FIGS. 1 and 1A depict an exploded perspective view of an information handling system having a thin housing formed with a secondary metal integrated as a pattern at an interior recess of a primary metal plate.

Referring now to FIG. 1, an exploded perspective view depicts an information handling system 10 having a thin housing 12 formed with a secondary metal integrated as a pattern at an interior recess of a primary metal plate. In the example embodiment, information handling system 10 has a convertible configuration with a base housing portion 14 rotationally coupled to a lid housing portion 16 with a hinge 17. A cover housing portion 18 is disposed over processing components disposed in base housing portion 14 and supports a keyboard 20 that accepts end user inputs through key touches. In alternative embodiments, information handling system 10 may have a tablet configuration having the processing components disposed in a single planar housing portion. In the example embodiment, processing components communicate through a motherboard 22 disposed in base housing portion 14. For instance, a central processing unit (CPU) 24 executes instructions to process information in cooperation with a random access memory (RAM) 26 that stores the instructions and information. An embedded controller 28 manages physical component operations, such as thermal and power systems, and interactions with input/output (I/O) devices, such as inputs by keyboard 20. A graphics processor unit (GPU) 30 interfaces with CPU 24 and processes information to generate pixel values that present visual images at a display panel 32 that integrates in lid housing portion 16. In alternative embodiments, a variety of components may be disposed in housing 12 that cooperate to process information and manage system operating conditions, such as a power supply, battery, cooling fan and persistent storage.

Figure 1A:
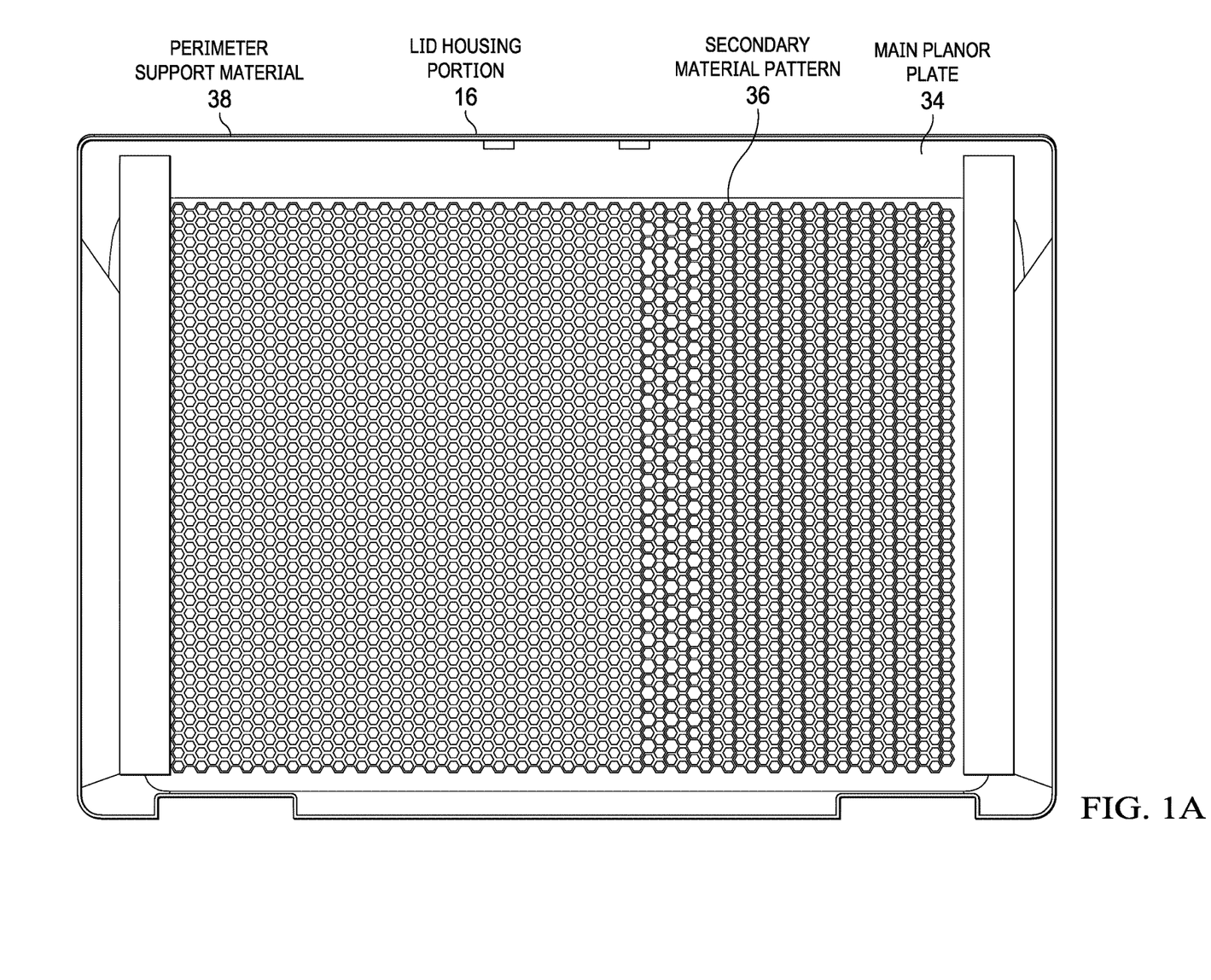

Referring now to FIG. 1A, a front view of lid housing portion 16 depicts an example embodiment of a reinforcing secondary material pattern 36 that improves housing stiffness with reduced primary metal thickness. Lid housing portion 16 is, for instance, a planar plate 34 of 7075 aluminum having a thickness of 0.6 mm with a planar exterior surface suitable as an information handling system exterior, such as with some machining of the planar exterior to curve the surface in an aesthetic manner. Lid housing portion 16 is formed at the interior surface to have a central region of less thickness than the outer perimeter, such as 0.4 mm, so that viewing the interior surface of the central region has a depth of greater than the perimeter based upon the reduced material thickness. A perimeter support material 38 couples to the perimeter of lid housing portion 16 to provide additional support. For instance, perimeter support material 38 is a ceramic material, such as aluminum oxide ceramic, a carbon fiber composite material or other supportive material that aids the robustness of the underlying main planar plate 34. A secondary material pattern 36 integrates with planar plate 34 in the central region. For example, lines of a steel alloy, such as a nano-structural stainless steel 4140, are laser sintered with an additive material three dimensional printing technique to form interconnected hexagons. In the example embodiment, the size and position of the central region and secondary material pattern 36 co-locate with a position of a battery 37 disposed in lid housing portion 16. In one example embodiment, the central region may be formed to have a greater depth with secondary material pattern 36 formed so that additional room is available within the housing for placement of battery 37.

In the example embodiment, a 0.6 mm aluminum housing is provided with strength of a thicker aluminum material by leveraging additional strength offered by a nanosteel pattern formed in a channel at the interior side of the housing using three dimensional printing of the nanosteel pattern on the aluminum interior surface. Locally formed channel recess areas allow strengthening of the housing in a targeted manner with various shapes that correspond to components within the housing that may need additional space. The location of the channel recess areas may be placed where additional housing strength is needed, such as hinge locations or areas that experience greater torsional forces. In various embodiments, different types of material may be used for both the housing and secondary material pattern, such as ceramics, carbon fiber, titanium and copper. For example, copper and ceramic materials may be used to provide thermal management and antenna windows. Advantageously, recycled copper and steel may be used. For the example embodiment, a number of different manufacture techniques may be used. In one example embodiment, a uniform housing thickness of 0.4 mm of aluminum is formed across the entire housing and then the central regions are reinforced with 0.2 mm thick lines of laser sintered stainless steel so that the central region has a thickness of 0.6 mm. In an alternative embodiment, an aluminum 6063 plate of 0.75 mm has the central region machined to a reduced thickness of 0.3 to 0.4 mm where the battery or other components are located within the housing. The areas of reduced thickness are then reinforced with laser sintered stainless steel 304 of 0.2 mm so that the location(s) of the components provide additional room for the components without impacting structure integrity. A 0.6 mm thick housing wall having an aluminum base and stainless steel reinforcement offers approximately the same strength as the aluminum plate at full thickness. In one example embodiment, the use of the pattern in the steel reinforcement reduces the weight from 119g if a plate of steel is used to 48g for the pattern so that the overall housing weight of a plate of aluminum is reduced from 145g to 131g with the steel reinforcement. In one embodiment, a nanosteel may be used having an alloy crystal structure that enhances the rigidity of the housing structure. Automobile grade aluminum, such as is available from NOVELIS, provides enhanced strength for the housing plate, such as a specific yield strength in MPa/g/cm2 of 107 for 6HS-s615 and up to 222 for next generation materials.

Figure 2:
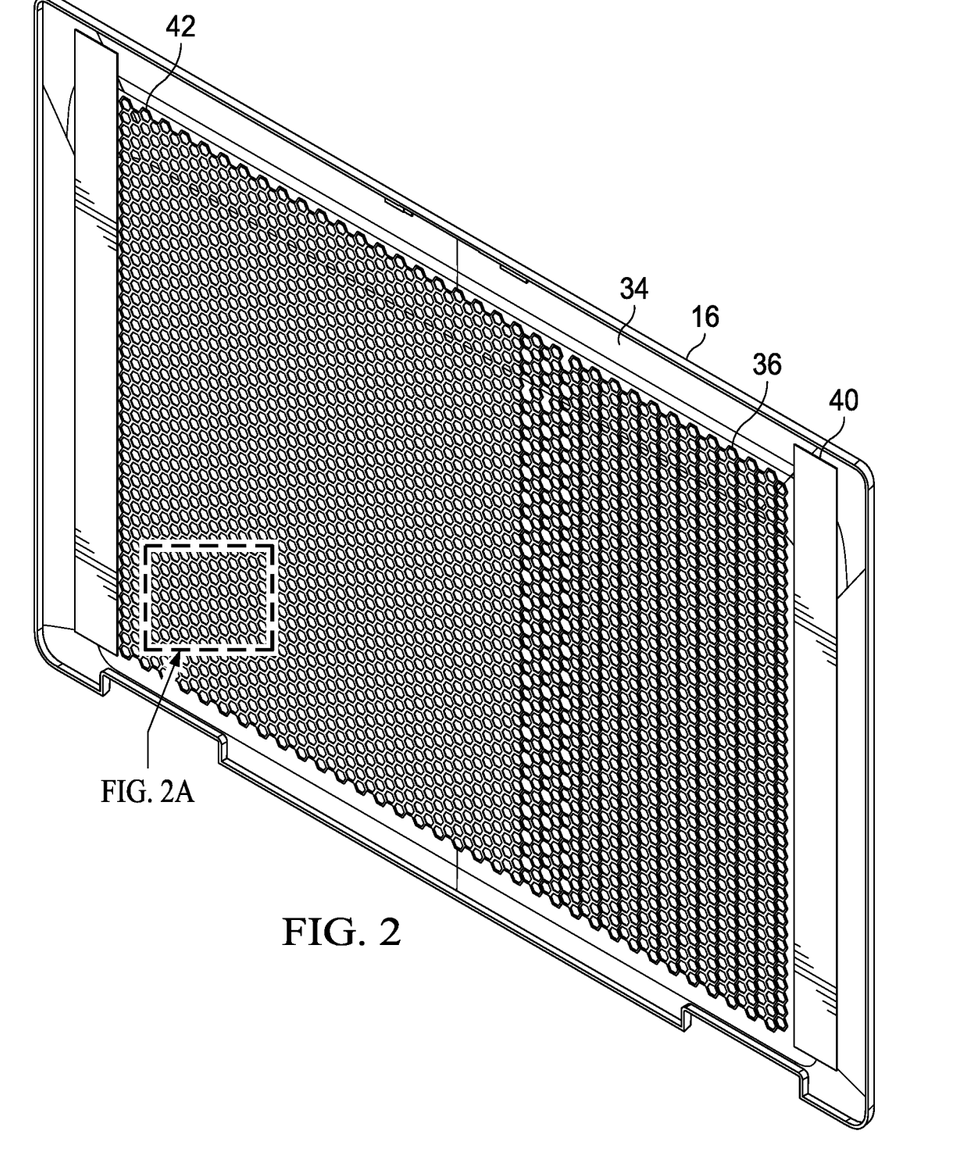
FIGS. 2, 2A and 2B depict a side perspective view of an example of an alternative embodiment of the interior surface of the lid housing portion.
Figure 2A:
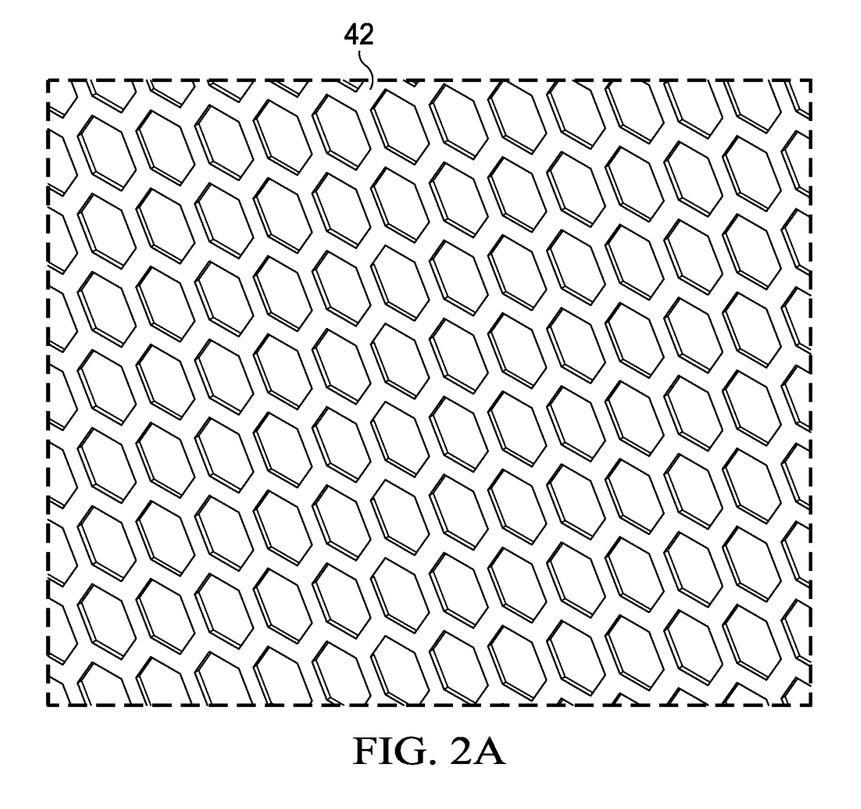
Figure 2B:
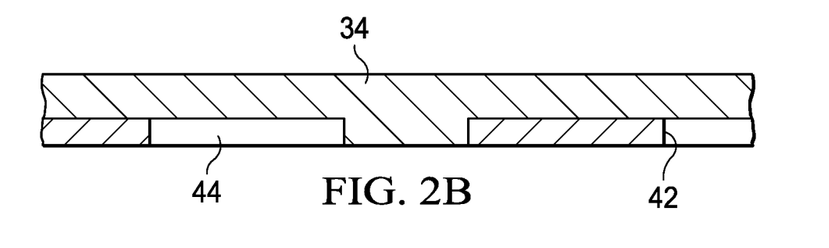

Referring now to FIGS. 2, 2A and 2B, a side perspective view depicts an example of an alternative embodiment of the interior surface of lid housing portion 16. In the example embodiment, main planar plate 34 has a greater thickness along its perimeter than its interior. A support arm 40 is coupled at opposing sides of planar plate 34 to enhance rigidity and mount a display panel. Within the perimeter of planar plate 34, a pattern of a secondary material 42 is integrated, such as with laser sintering, to form a pattern. FIG. 2A depicts an example pattern of interconnected hexagons of secondary material 42 formed by laser sintered lines of stainless steel. FIG. 2B depicts a side cutaway view of lid housing 16 to illustrate one example of integration of the secondary material 42 within planar plate 34. In the example embodiment, an open region 44 is etched in planar plate 34 where secondary material 42 is laser sintered so that the total thickness of lid housing 16 equals the thickness at the perimeter. In the example embodiment, open region 44 provides less material proximate secondary material 42 to help reduce weight while the more stiff secondary material aids lid housing portion 16 stiffness so that a thinner planar plate 34 may be used for the housing. In an alternative embodiment, secondary material 42 may fill the entire opening. As described above, secondary material 42 may also form the pattern as a raised material over a planar surface rather than within the etched openings.

Figure 3:
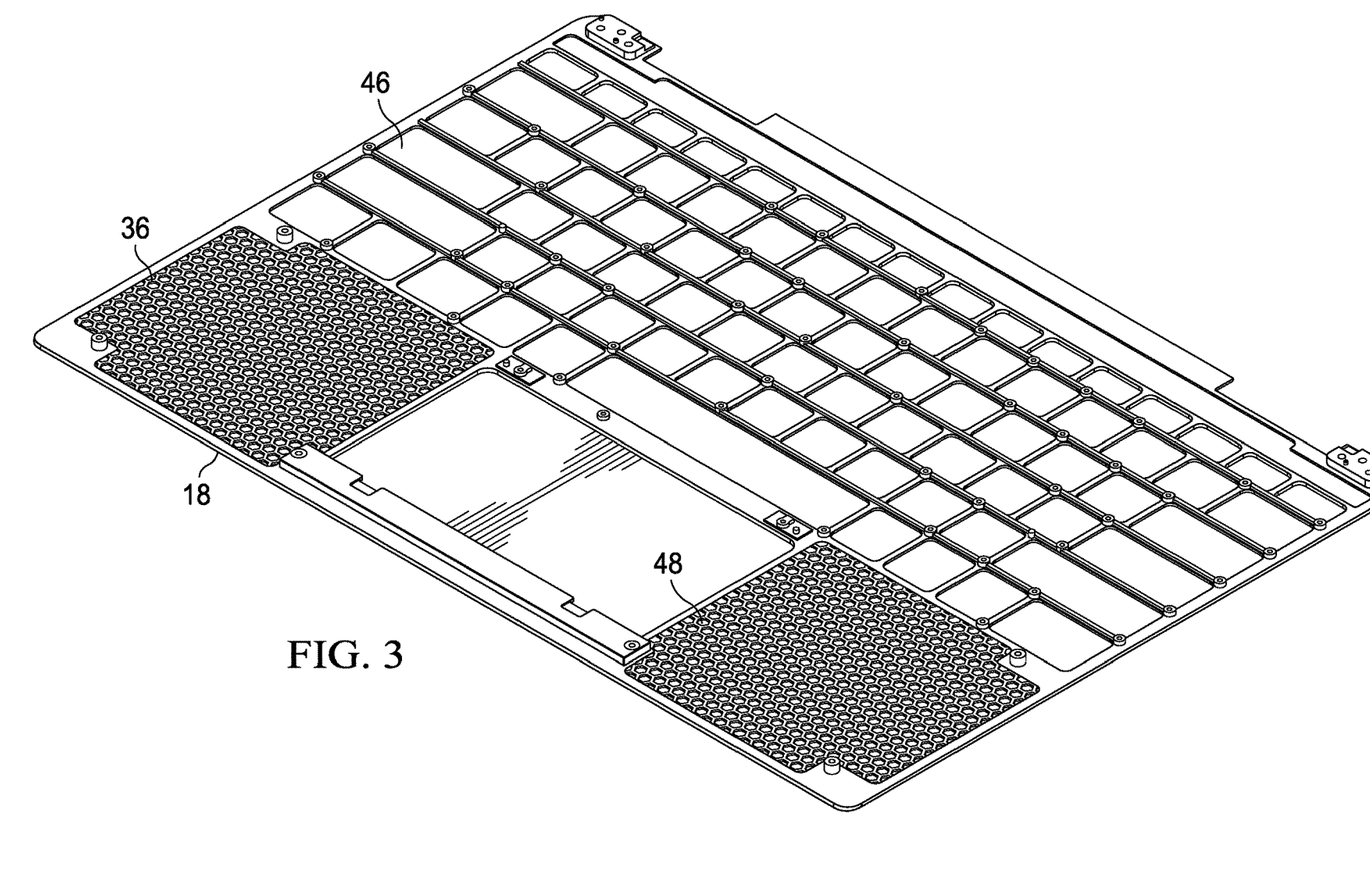
FIG. 3 depicts a side perspective view of a secondary material reinforcement of cover housing portion 18 at a palm rest.

Referring now to FIG. 3, a side perspective view depicts a secondary material reinforcement of cover housing portion 18 at a palm rest. A recess depth 48 is formed in cover housing portion 18 on both sides of an opening that provides room for a touchpad at a base of where key openings 46 are formed. A secondary material pattern 36 is integrated in cover housing portion 18 in each recessed depth to provide reinforcement with an overall thinner material. In the example embodiment, the pattern has interconnected hexagons, however, in alternative embodiments other patterns may be used, such as squares, rectangles, diamonds and circles. Further, various sized patterns may be used to balance the weight of the housing portion and the amount of stiffness called for by the housing constraints.

Figure 4:
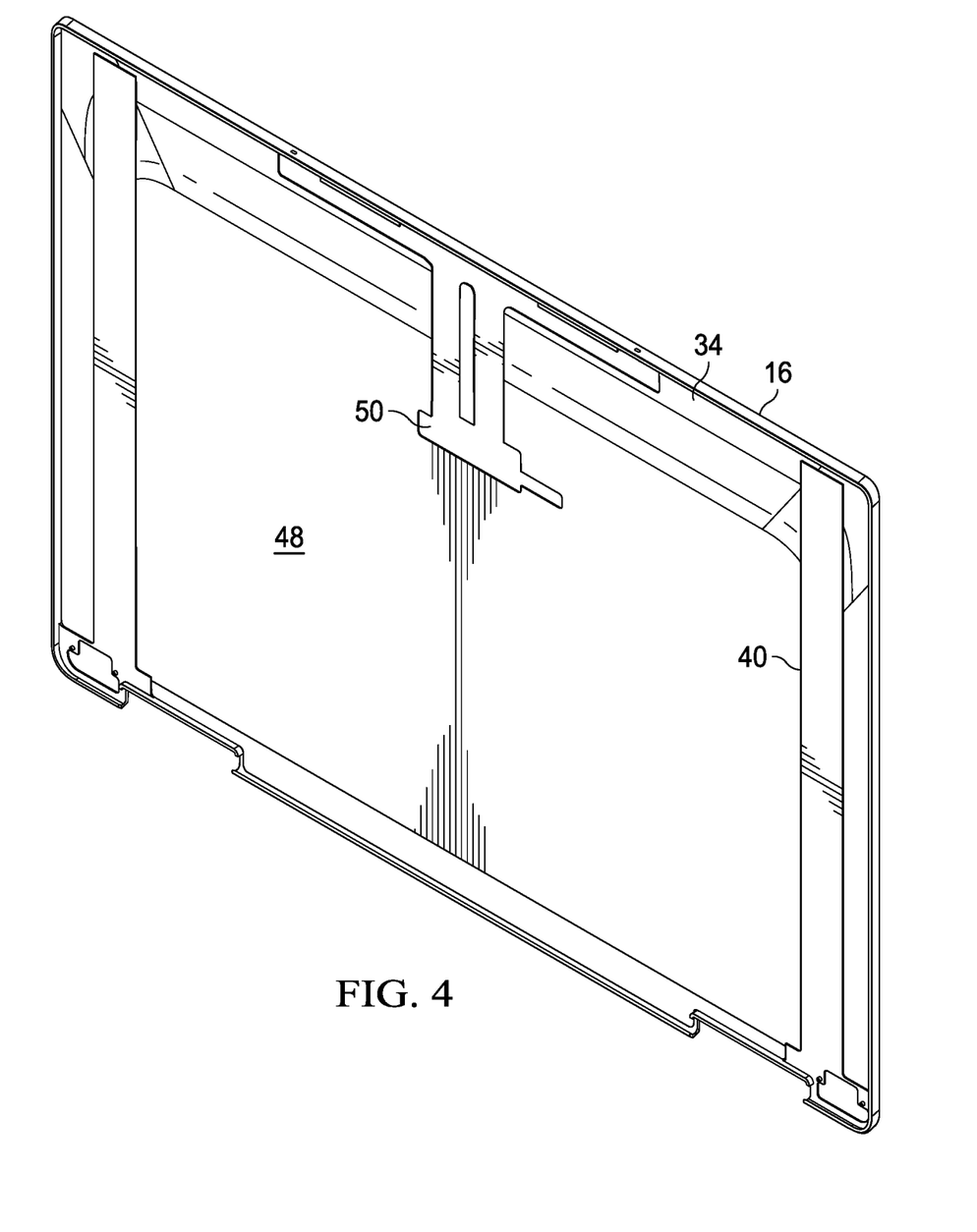
FIG. 4 depicts a side perspective view of a lid housing portion example embodiment having opening formations that support component placement.

Referring now to FIG. 4, a side perspective view of lid housing portion 16 depicts an example embodiment having opening formations 50 that support component placement. The openings 50 are formed in planar plate 34 to align with placement of components in the information handling system, such as a camera, microphone, speakers or hinge support. For instance, planar plate 34 is 0.75 mm thick aluminum that has openings 50 formed by machining or other methods to a thickness of 0.3 to 0.4 mm versus a thickness of 0.75 mm at regions 48 that are not machined. Opening 50 is then reinforces with a secondary material pattern, such as hexagons of stainless steel of 0.2 mm thickness so that additional depth is provided in the openings to accept components relative to the depth at region 48. The secondary material patterns improve housing stiffness to provide a robust solution.

Figure 5:
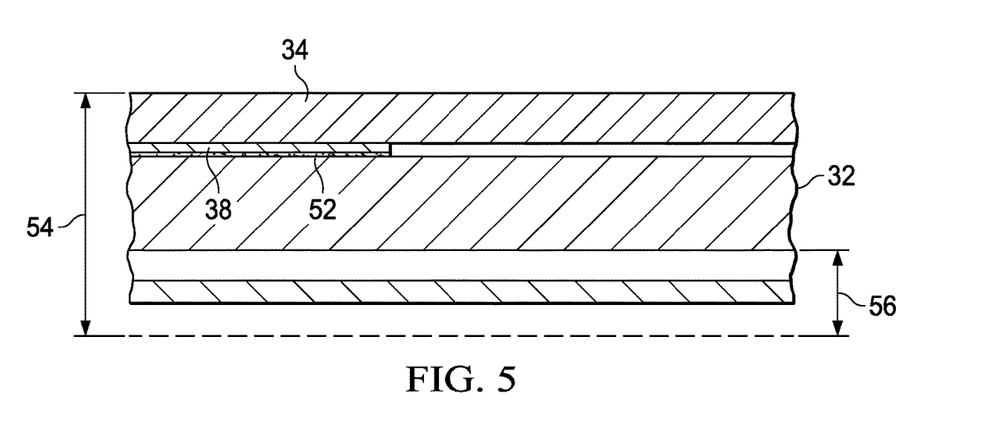
FIG. 5 depicts a side cutaway view of an example of a housing stack for a lid housing portion.

Referring now to FIG. 5, a side cutaway view depicts an example of a housing stack for a lid housing portion such as used as a laptop information handling system display housing. The display housing plate 34 has a uniform thickness to meet defined stiffness constraints. An internal protrusion 38 of the display housing plate 34 provides a mounting surface for display panel adhesive tape 52 and the display panel 32. The relative internal system gap is shown as the vertical distance from the display surface to a system palmrest 56. The total stack height of the display housing is represented by arrow 54 The stack of materials define a thickness of the housing portion post assembly and includes a thicker assembly to meet stiffness constraints with a solid aluminum planar plate.

Figure 6:
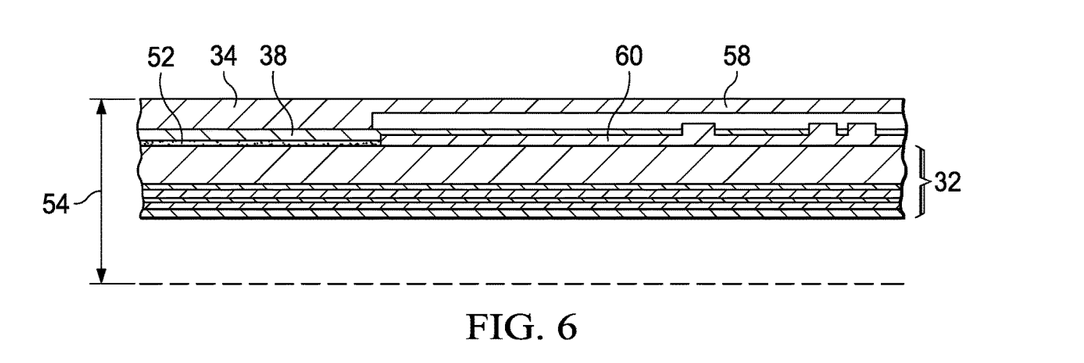
FIG. 6 depicts a side cutaway view of an example of a housing stack for a lid housing portion reinforced by a secondary material.

Referring now to FIG. 6, a side cutaway view depicts an example of a housing stack for a laptop display housing, such as lid housing portion plate 34 reinforced by a secondary material 58. A reduced thickness is supported by defining openings in the planar plate to insert secondary material so that a cover plate 48 has a reduced thickness. With the reduced thickness, additional components 60 fit between the inner surface of cover plate 48 at secondary material 58 and display panel 32, which is held in place by adhesive tape 52 at a perimeter support material 38. In addition, the spacing to palm rest 54 is increased to provide additional space within the housing. Alternatively the same gap from the display to palmrest 56 can be maintained to enable an overall reduced system thickness while meeting the same stiffness constraints.

Figure 7:
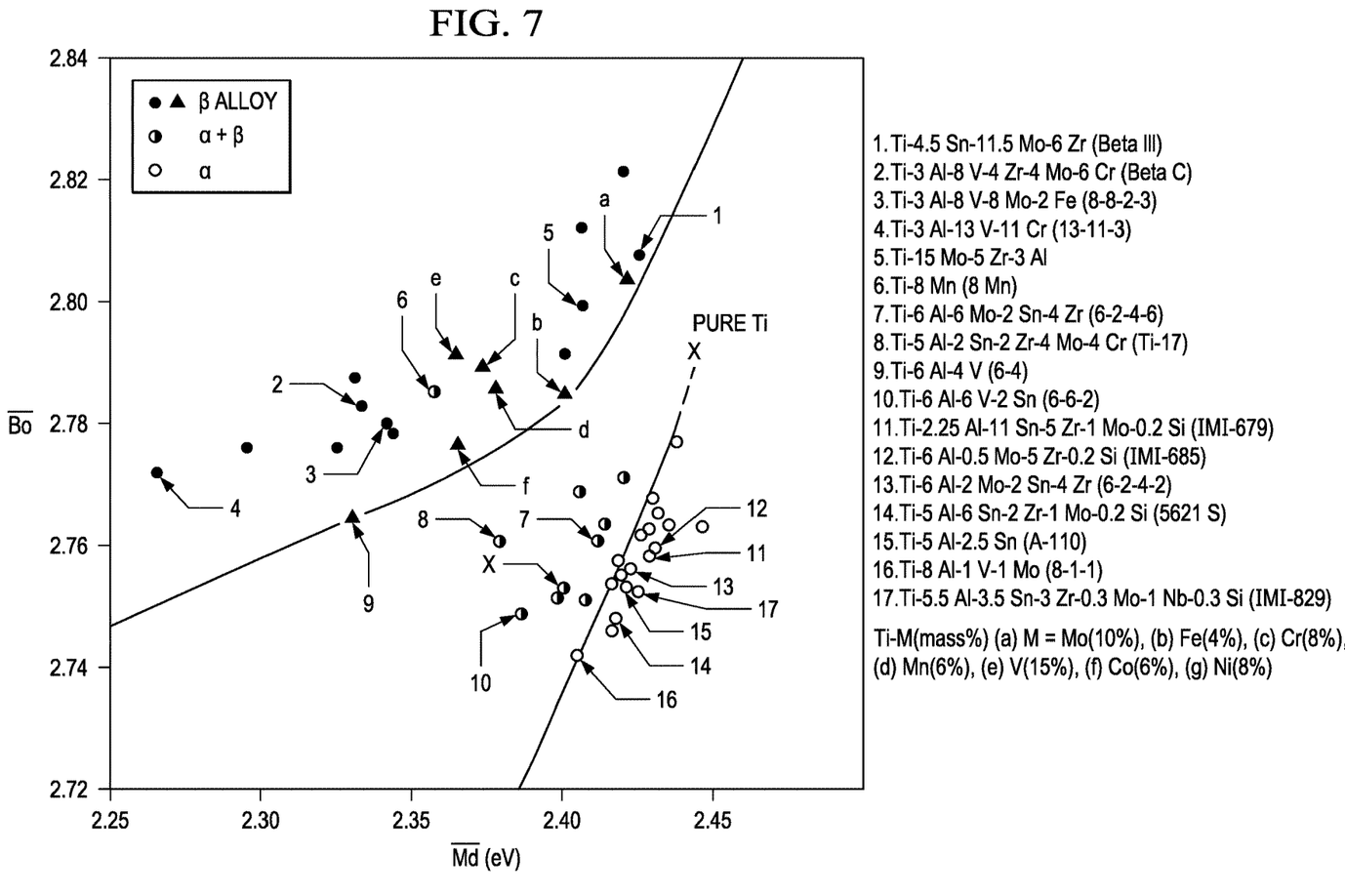
FIG. 7 depicts a chart of a variety of materials that may be used as a secondary material to provide support to the planar plate, such as an aluminum plate material.

Referring now to FIG. 7, a chart depicts a variety of materials that may be used as a secondary material to provide support to the planar plate, such as an aluminum plate material. The examples include a variety of titanium alloys having varying masses of tin, molybdenum, zirconium, aluminum, iron, chromium, manganese, vanadium, cobalt, copper and nickel. Selection of a particular secondary material may be based upon bonding of the selected alloy at the microstructure of the aluminum plate during laser sintering, such as based upon a microstructure and alloy used for the aluminum plate. In addition, the secondary material may be selected to aid in thermal transfer of the housing, such as by including at least some lines of a thermally conductive material, such as copper.

Although the present invention has been described in detail, it should be understood that various changes, substitutions and alterations can be made hereto without departing from the spirit and scope of the invention as defined by the appended claims.

What is claimed is:

1. A method for manufacture of a housing of an information handling system, the method comprising:
    forming the housing of the information handling system from a planar plate of a first metal to have an outer perimeter of a first thickness and a central region of a second thickness of less than the first thickness; and
    laser sintering a pattern onto the central region with a second metal, the pattern having plural interconnected shapes formed by lines of the second metal.

2. The method of claim 1 wherein the pattern comprises plural hexagons.

3. The method of claim 2 wherein the first metal comprises aluminum and the second metal comprises stainless steel.

4. The method of claim 1 further comprising:
    locating the central region at a placement location of a component of the information handling system, the central region having a perimeter of slightly greater than a perimeter of the component; and
    assembling the housing to enclose the component aligned with the central region.

5. The method of claim 4 wherein the component comprises a battery.

6. The method of claim 1 further comprising:
    locating the central region at a palm rest of a keyboard cover; and
    assembling the housing to cover a keyboard.

7. The method of claim 1 further comprising:
    coupling a carbon fiber composite frame to a perimeter of the housing; and
    assembling a display in the housing within the carbon fiber composite frame.

8. The method of claim 1 further comprising integrating copper with the second metal.

* * * * *